United States Patent [19]
Rogers et al.

[11] Patent Number: 5,983,013
[45] Date of Patent: Nov. 9, 1999

[54] METHOD FOR GENERATING NON-BLOCKING DELAYED CLOCKING SIGNALS FOR DOMINO LOGIC

[75] Inventors: Alan C. Rogers; Edgardo F. Klass, both of Palo Alto; Chaim Amir, Sunnyvale; Jason M. Hart, Mt. View, all of Calif.

[73] Assignee: Sun Microsystems, Inc., Palo Alto, Calif.

[21] Appl. No.: 08/884,840

[22] Filed: Jun. 30, 1997

[51] Int. Cl.$^6$ .............................. G06F 1/04; H03K 19/00
[52] U.S. Cl. .............................................. 395/556; 326/96
[58] Field of Search .................................. 395/555, 556; 326/93, 96

[56] References Cited

U.S. PATENT DOCUMENTS

| | | | |
|---|---|---|---|
| 3,935,474 | 1/1976 | Komarek | 326/96 |
| 5,295,164 | 3/1994 | Yamamura | 375/376 |
| 5,434,520 | 7/1995 | Yetter et al. | 326/93 |
| 5,517,136 | 5/1996 | Harris et al. | 326/93 |
| 5,578,946 | 11/1996 | Carberry et al. | 326/96 X |
| 5,751,665 | 5/1998 | Tanoi | 368/120 |

*Primary Examiner*—Thomas M. Heckler
*Attorney, Agent, or Firm*—McDermott, Will & Emery

[57] ABSTRACT

A method for generating non-blocking multiple-phase clocking system for use with domino-type dynamic logic includes receiving a primary clock signal and generating several delayed phases of the received primary clock signal. The number of clock phases equals the number of dynamic logic gates in the circuit. The method provides a first clock phase to the first dynamic logic gate of the circuit, a second clock phase to the second dynamic logic gate and so on. A timing analysis is performed of each logic path in the circuit to determine the arrival time of each critical input signals to each dynamic logic gate. The delay between adjacent clock phase is then predetermined so that each dynamic logic gate enters its evaluation phase before the critical input signal(s) to the particular dynamic logic gate arrives. This adjustment of the clock phases maximizes the logic evaluation speed of the dynamic logic circuit.

20 Claims, 8 Drawing Sheets

METHOD FOR GENERATING NON-BLOCKING DELAYED CLOCKING SIGNALS FOR DOMINO LOGIC

FIELD OF THE INVENTION

The present invention relates to clocking systems and, more particularly, to clocking systems for circuits with domino logic gates.

BACKGROUND

Some high performance circuits such as, for example, microprocessors, are implemented using dynamic logic gates. As is well known, dynamic logic gates in general allow the design of faster circuits compared to conventional CMOS circuits. Generally, dynamic logic gates operate in a precharge phase and an evaluation phase. For example, FIG. 1 schematically illustrates a typical conventional dynamic logic gate 100 of the domino type. In this example, the logic gate 100 implements a three-input AND gate. The logic gate 100 includes a precharge p-channel transistor PC and an evaluation n-channel transistor EV, each having a gate coupled to receive a clock signal CK. The logic gate 100 also includes three n-channel transistors N1–N3 connected in series (i.e. with channel regions connected end-to-end) between the drains of the precharge and evaluation transistors PC and EV. The gates of these three n-channel transistors are connected to respectively receive three input signals A, B, and C. The drain of the precharge transistor PC is also connected to a CMOS inverter 102 (implemented by a p-channel transistor P1 and an n-channel transistor N4) through a node OUTN. The CMOS inverter 102 provides an output signal OUT at an output lead 104.

FIG. 2 is a timing diagram illustrating the operation of the logic gate 100. Although the operation of the logic gate 100 is well known to those skilled in the art of dynamic logic gates, the following description is provided for completeness. A falling edge of the clock signal CK initiates a precharge phase by turning on the precharge p-channel transistor PC and turning off the evaluation n-channel transistor EV. Consequently, during the precharge phase, the precharge transistor PC pulls up the voltage at the node OUTN, thereby causing the CMOS inverter 102 to generate the output signal OUT with a logic low level.

In contrast, a rising edge of the clock signal CK causes the logic gate 100 to enter the evaluation phase by turning off the precharge transistor PC and turning on the evaluation transistor EV. As a result, during the evaluation phase, the precharge transistor PC no longer pulls up the voltage at the node OUTN. In addition, the series connected n-channel transistors N1–N3 and the evaluation transistor EV can implement a conductive path between the node OUTN and ground (e.g., the VSS voltage source). In this example, the input signals A, B, and C all transition to a logic high level during the evaluation phase, thereby causing the n-channel transistors N1–N3 to turn on and discharge the node OUTN. Accordingly, the inverter 102 causes the output signal OUT to transition to a logic high level. Of course, had one or more of the input signals A-C remained at a logic low level during this evaluation phase, the pulldown path would have remained open-circuited, causing the node OUTN and the output signal OUT to remain at a logic high and logic low level, respectively.

FIG. 3 illustrates an exemplary logic subcircuit 300 implemented with interconnected dynamic logic gates 301–306. A flip-flop circuit 308 is connected to provide one or more input signals to the dynamic logic gates 301–306. A flip-flop circuit 310 is connected to receive one or more output signals generated by the dynamic logic gates 301–306. It will be understood by those skilled in the art of dynamic logic that large numbers of subcircuits similar to the logic subcircuit 300 can be interconnected to form a complex circuit such as a microprocessor. A single clock signal CK is used to clock all of the logic gates and flip-flop circuits of the logic subcircuit 300. As a result, while the clock signal CK is at a logic low level (i.e., during the precharge phase) the logic subcircuit 300 performs no logic function. Because the precharge phase of a typical dynamic flip-flop requires about 20%–30% of the cycle time in current CMOS processes, only about 70%–80% of each clock cycle is available for logic operation. The "wasted" 20%–30% results in sub-optimal operation of the logic circuit 300 from a logic operation perspective.

One conventional scheme to more efficiently use each clock cycle is illustrated in FIG. 4. In this scheme, a logic subcircuit 400 is configured so that the flip-flop circuit 308 and the dynamic logic gates 301–303 are connected to receive a first clock signal CK1. The logic gate 303 is connected to provide one or more output signals to a rising edge triggered latch 401, which in turn provides one or more output signals to the dynamic logic gates 304–306. The latch 401 and the logic gates 304–306 are clocked with a second clock signal CK2.

In this type of scheme, the clock signals CK1 and CK2 implement a "non-overlapping" two-phase clocking system. More specifically, as shown in FIG. 5, the clock signal CK2 is the complement of the clock signal CK1. Thus, the precharge and evaluation phases of the clock signal CK1, respectively, do not overlap the precharge and evaluation of the clock signal CK2. Because the clock signals do not overlap, the logic gates driven by the latch 401 will be operating in the precharge phase when the logic gates driven by the flip-flop circuit 308 are operating in the evaluation phase and vice versa. Thus, for example, when the clock signal CK1 is at a logic high level, the logic gates 301–303 perform a logic function on the input signals provided by the flip-flop circuit 308. During this time period, the latch 401 receives the clock signal CK2 with a logic low level, which causes the latch 401 to be disabled. Then, when the clock signals CK1 and CK2, respectively, transition to the logic low and logic high levels, the output signal(s) of the logic gates 301–303 are latched by the latch 401 and provided to the logic gates 304–306, which are now in the evaluation phase. Unlike the logic subcircuit 300 (FIG. 3), this scheme allows the logic subcircuit 400 to perform logic operations during the entire cycle time by "hiding" the precharge time of one group of logic gates during the evaluation phase of the other group of logic gates.

However, the non-overlapping two-phase clocking system has several shortcomings. For example, the latch 401 undesirably increases the propagation delay of the subcircuit by about one gate delay. In addition, skew and jitter between the clock signals CK1 and CK2 is generally accounted for by increasing the set-up time of the latch, resulting in a wasted use of a portion of the cycle time. That is, the latency of the latch 401, in effect, takes time out of the cycle time, thereby reducing the time available in the cycle time for performing logic operations.

Still further, as is well known in the art of dynamic logic, the latch 401 in conjunction with the complementary two phase clocking causes the so-called "quantization effect" which results when the "first" group of logic gates (i.e., logic gates 301–303 in this example) does not have substantially the same propagation delay as the "second" group of logic gates (i.e., logic gates 304–306 in this example). Perfect balance is hard to achieve in practice because of the quantized nature of gate delays. This quantization effect may add up to a gate delay penalty. The combined time penalties due to the insertion of the latch 401 are between approximately two and three gate delays. Thus, there is a need for a method of generating clock phases for the dynamic logic subcircuit that efficiently uses the entire cycle time for logic operations without the time penalties of the non-overlapped two-phase clocking system.

SUMMARY

In accordance with the present invention, a method is provided for generating multiple non-blocking clock phases for use with dynamic logic. In one embodiment, the includes receiving a primary clock signal and then generating a series of delayed clock signals (alternatively referred to herein as clock phases) with overlapping evaluation phases to a circuit or subcircuit including a group of interconnected domino type dynamic logic gates. In particular, a different clock phase is provided to each dynamic logic gate in the circuit, with each clock phase lagging, the clock phase provided to the previous dynamic logic gate in the logic path of the circuit. In accordance with the present invention, the clock phases are generated with a predetermined delay between adjacent clock phases.

Consequently, the output signal generated by a dynamic logic gate in a particular clock phase can be evaluated in the next clock phase by the next dynamic logic gate in the logic path. In this manner, signals propagating along a logic path are evaluated in subsequent phases of the clock signal, producing the effect of an evaluation phase that extends from the beginning of the cycle to the end of the cycle. As a result, the precharge operation of a particular clock phase occurs after the next dynamic logic gate has evaluated (or the last flip-flop captures) the output signal of that particular clock phase's associated dynamic logic gate. Thus, the precharge time of each clock phase is "hidden", with no impact on the propagation delay of the signal. Because of the overlapping of the clock signals, no latch is used. As a result, the shortcomings described above arising from the use of a latch and non-overlapping clock signals are avoided.

In a further refinement, a timing analysis of all of the critical signals in the logic path is performed to determine the arrival time of each critical signal(s) to each dynamic logic gate in the logic path. The delays between adjacent clock phases are adjusted so that the clock phases are "non-blocking". The term "non-blocking" is used herein to refer to a clock phase that enters the evaluation phase before the arrival of the critical input signal to the dynamic logic gate associated with the clock phase. The term "critical input signal" is used herein to refer to the latest arriving input signal to a particular dynamic logic gate. Consequently, unlike conventional non-overlapped two-phase clocking systems, this feature allows for the dynamic logic gate to immediately operate on the critical input signal(s) without having to "wait" for the clock phase to enter the evaluation phase. As a result, critical signals can propagate through the dynamic logic circuit without the additional time penalties associated with the insertion of latches.

In addition, to ensure that valid output signals are received by the next "downstream" dynamic logic gate, the clock phases are adjusted so that a particular dynamic logic gate receives its critical input signal(s) after the start of the evaluation phase of the clock phase but before the start of the evaluation phase of the subsequent adjacent clock phase. More specifically, by adjusting the delays between the clock phases so that each dynamic logic gate receives its critical input signal(s) before the start of the evaluation phase of any subsequent clock phase, the dynamic logic gate will generate its slowest output signal with at least the minimum pulse width required by the receiving dynamic logic gate(s).

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 6:
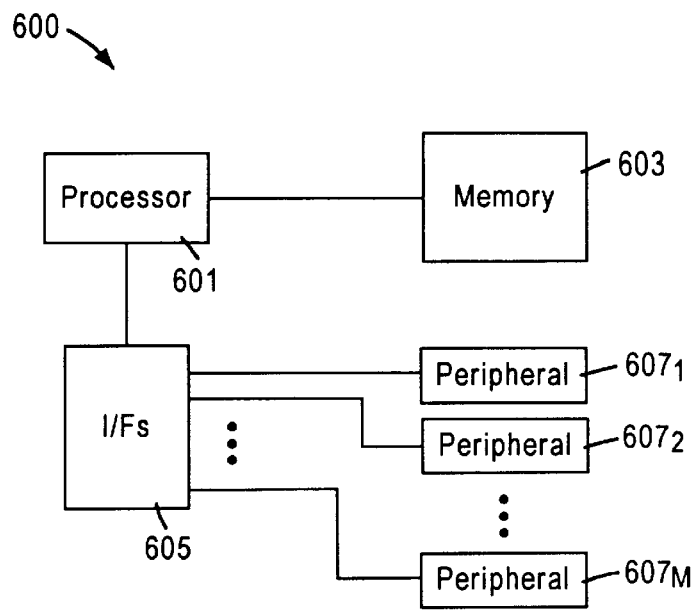
FIG. 6 is a block diagram of an electronic system having an integrated circuit using a non-blocking multiple-phase clocking system, according to one embodiment of the present invention.

FIG. 6 is a block diagram of an electronic system 600 according to one embodiment of the present invention. The electronic system 600 includes in an integrated circuit 601 having dynamic logic gates clocked using a non-blocking multiple-phase clocking system (described below in conjunction with FIGS. 7–15), a memory 603, interfaces 605 and peripherals $607_1$–$607_M$.

The electronic system 600 can be any type of electronic system. In this embodiment, the electronic system 600 is a computer system in which the integrated circuit 601 is a processor connected to the memory 603 and to interfaces 605. The processor can be any type of processor such as, for example, X86, Pentium®, Sparc®, Alpha®, MIPS®, HP®, and PowerPC® processors. The interfaces 605 are connected to peripherals $607_1$–$607_M$, thereby allowing the processor to interact with these peripherals. The memory 603 and the interfaces 605 can be any type of memory or interface for use in computer systems. Likewise, the peripherals can be any type of peripheral such as, for example, displays, mass storage devices, keyboards or any other type of input or input-output device.

Figure 7:
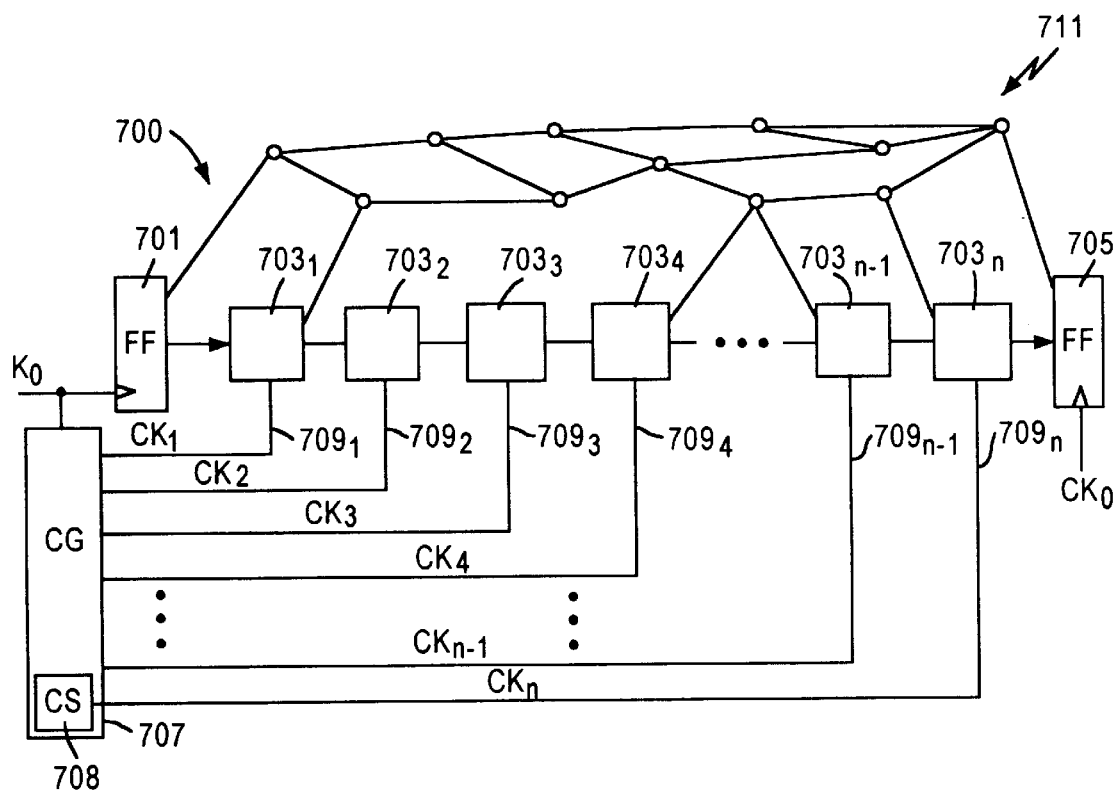
FIG. 7 is a block diagram of a dynamic logic subcircuit using a non-blocking multiple-phase clocking system, according to one embodiment of the present invention.

FIG. 7 is a block diagram of a generalized dynamic logic subcircuit 700 using a non-blocking multiple-phase clocking system according to one embodiment of the present invention. The subcircuit 700 includes a flip-flop 701 and n dynamic logic gates. In this embodiment, the dynamic logic gates are domino logic gates, although in other embodiments other types of dynamic logic may be used. More specifically, the subcircuit includes dynamic logic gates $703_1$–$703_n$. Of course, in some embodiments, "n" dynamic logic gates may be as few as two dynamic logic gates, depending on the application. The subcircuit 700 also includes a second flip-flop 705 and a clock generator 707.

With reference to FIG. 7, those skilled in the art of dynamic logic circuits will appreciate that the dynamic logic circuits $703_1$–$703_n$ represent one logic path through the subcircuit 700. In addition, the subcircuit 700 may include other dynamic logic gates, for example, dynamic logic gates 711, in a multiple tree structure for providing desired logic functions. In this example circuit, the dynamic logic gates are interconnected with the dynamic logic gates $703_1$–$703_n$. Of course, in other embodiments the number of dynamic logic gates and the interconnection between the dynamic logic gates depends on the application.

The subcircuit 700 is interconnected as follows. The dynamic logic gates $703_1$–$703_n$ are connected in series or cascade, with the dynamic logic gate $703_1$ generating output signals that serve as input signals to (i.e., "driving") the dynamic logic gate $703_2$. Similarly, the dynamic logic gate $703_2$ provides an input signal(s) to the dynamic logic gate $703_3$ and so on, with the dynamic logic gate $703_{n-1}$ driving the dynamic logic gate $703_n$. The flip-flop 701 is connected to provide an input signal to the first dynamic logic gate $703_1$ in the logic path, whereas the flip-flop 705 is connected to receive the output signal of the last flip-flop $703_n$ in the logic path. The flip-flops 701 and 705 are clocked by a primary clock signal $CK_0$.

The clock generator 707 is connected to receive the primary clock signal $CK_0$ and to provide clock signals with overlapping evaluation phases to the n sets of dynamic logic gates. In this embodiment, the dynamic logic gate $703_1$ is connected to receive a clock phase $CK_1$ from the clock generator 707 through a line $709_1$. Similarly, the clock generator 707 provides a clock signal $CK_2$ to the dynamic logic gate $703_2$ through a line $709_2$ and so on, with the clock generator 707 providing a clock signal $CK_n$ to the dynamic logic gate $703_n$ through a line $709_n$.

Figure 8:
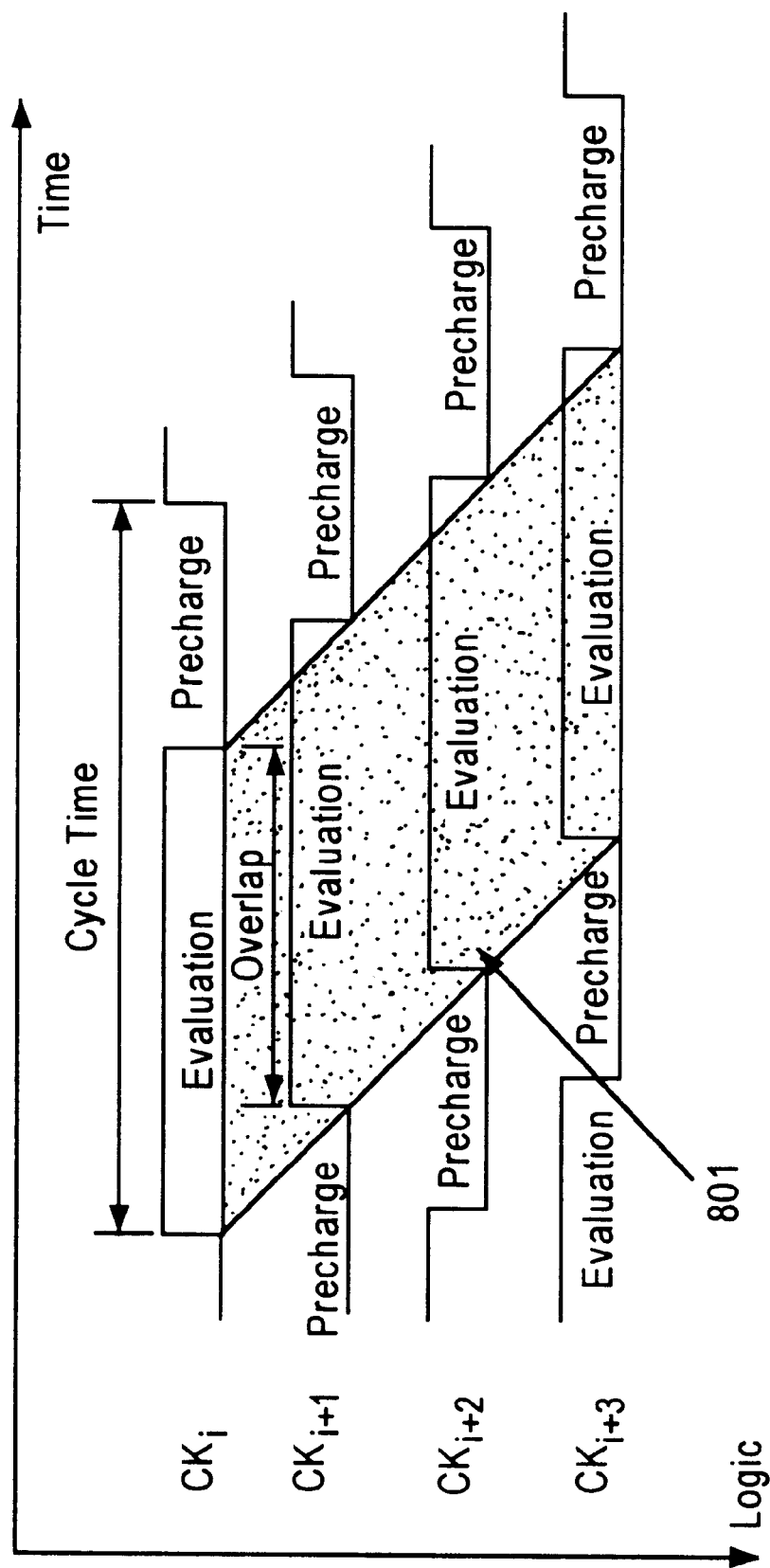
FIG. 8 is a timing diagram illustrating the clock signal timing of one embodiment of a non-blocking multiple-phase clocking system according to the present invention.

FIG. 8 is a timing diagram illustrating the evaluation overlap of three of the clock phases generated by the clock generator 707 (FIG. 7). The clock generator 707 provides the clock phases $CK_1$ through $CK_n$ to the dynamic logic gates $703_1$–$703_n$ so that relative to an arbitrary clock phase $CK_i$, the adjacent or next subsequent clock phase $CK_{i+1}$ lags the clock phase $CK_i$ by a predetermined time period. In this embodiment, each dynamic logic gate of the subcircuit 700 enters the evaluation phase when the logic gate's corresponding clock signal transitions to a logic high level and enters the precharge phase when the logic gate's clock signal transitions to a logic low level. The evaluation overlap time between clock signals $CK_i$ and $CK_{i+1}$ is defined herein as the time period between the rising edge of the clock signal $CK_{i+1}$ and the falling edge of the clock signal $CK_i$. Thus, the delay provided by the clock generator 707 between the clock phases $CK_i$ and $CK_{i+1}$ cause the evaluation phases of the clock phases $CK_1$ and $CK_{i+1}$ to overlap as shown in FIG. 8.

Similarly, the clock generator 707 generates the next adjacent clock signal $CK_{i+2}$ lagging the clock signal $CK_{i+1}$ by a predetermined time period, defining an evaluation overlap time from the rising edge of the clock signal $CK_{i+2}$ and the falling edge of the clock signal $CK_{i+1}$. Likewise, the clock generator 707 generates the next adjacent clock signal $CK_{i+3}$ lagging the clock signal $CK_{i+2}$ with a predetermined delay, and so on until the last clock signal $CK_n$ is generated. Together, all of the evaluation overlap periods form an evaluation region 801. As can been seen in FIG. 8, over the entire cycle time, at least one clock signal is in the evaluation phase. This feature allows an output signal that is generated by a dynamic logic gate in one evaluation phase to be used as an input signal to a dynamic logic gate in a subsequent evaluation phase. In this manner, the entire cycle time can be used by the subcircuit 700 to perform logic operations, which can significantly increase the speed of the subcircuit 700.

Figure 9:
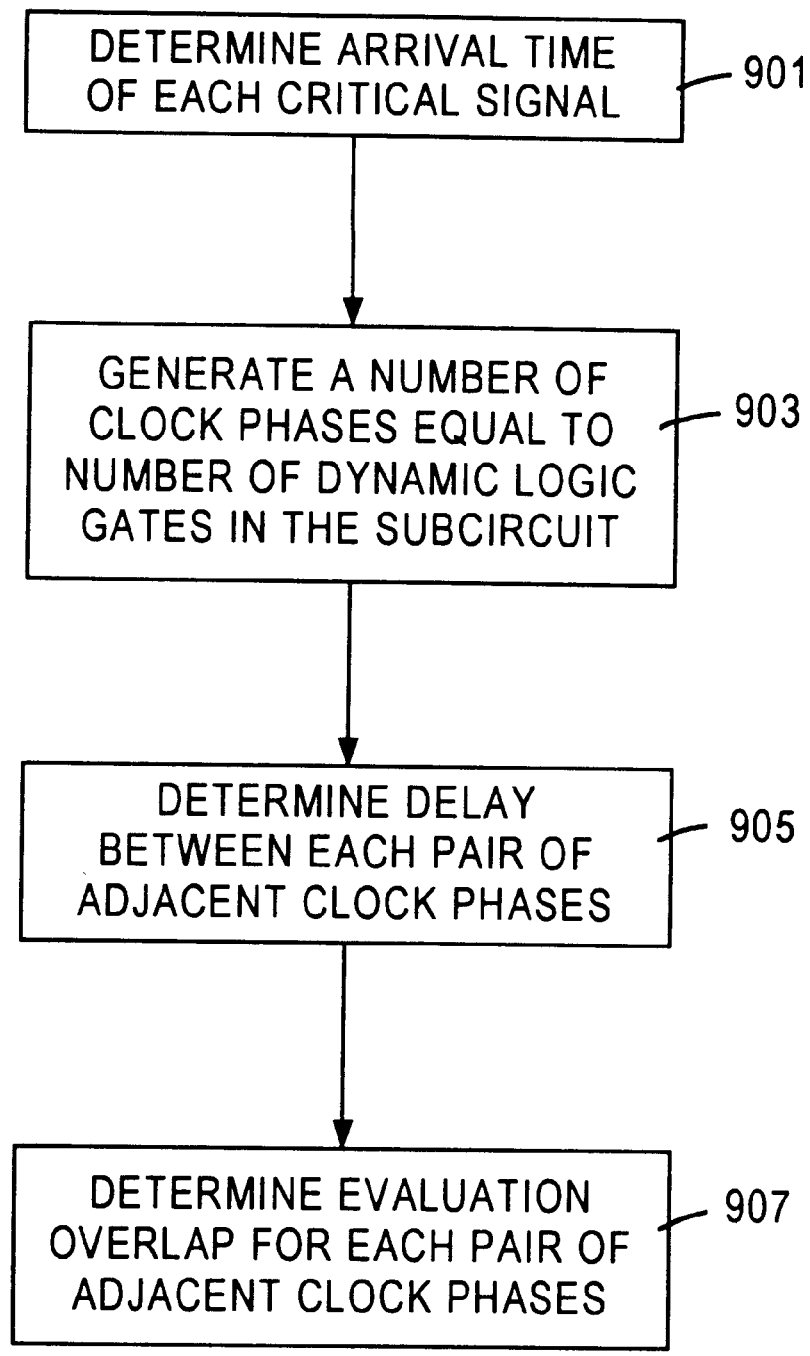
FIG. 9 is a flow diagram illustrative of the operation of the non-blocking multiple-phase clocking system of FIG. 7, according to one embodiment of the present invention.

FIG. 9 is a flow diagram illustrating the methodology of the non-blocking multiple-phase clocking system of the present invention. Referring to FIGS. 7 and 9, one embodiment of the clocking system is implemented as follows. In a first step 901, a timing analysis is performed to determine the arrival times of the critical signal(s) to each dynamic logic gate $703_1$–$703_n$.

In a next step 903, the clock generator 707 is implemented to provide n clock phases $CK_1$–$CK_n$ to the n dynamic gates $703_1$–$703_n$, with the clock phase $CK_1$ leading the clock phase $CK_2$, and the clock phase $CK_2$ leading the clock phase $CK_3$ and so on to the last clock phase $CK_n$. Each clock phase is received by a corresponding dynamic logic gate (i.e., the dynamic logic gate $703_1$ receives the clock phase $CK_1$, the dynamic logic gate $703_2$ receives the clock phase $CK_2$ and so on). In particular, the clock generator 707 inserts a delay between each clock phase so that the clock phases so that each dynamic logic gate in the logic path receives a clock phase overlapping and slightly lagging the clock phase received by the previous dynamic logic gate in the logic path.

Figure 1:
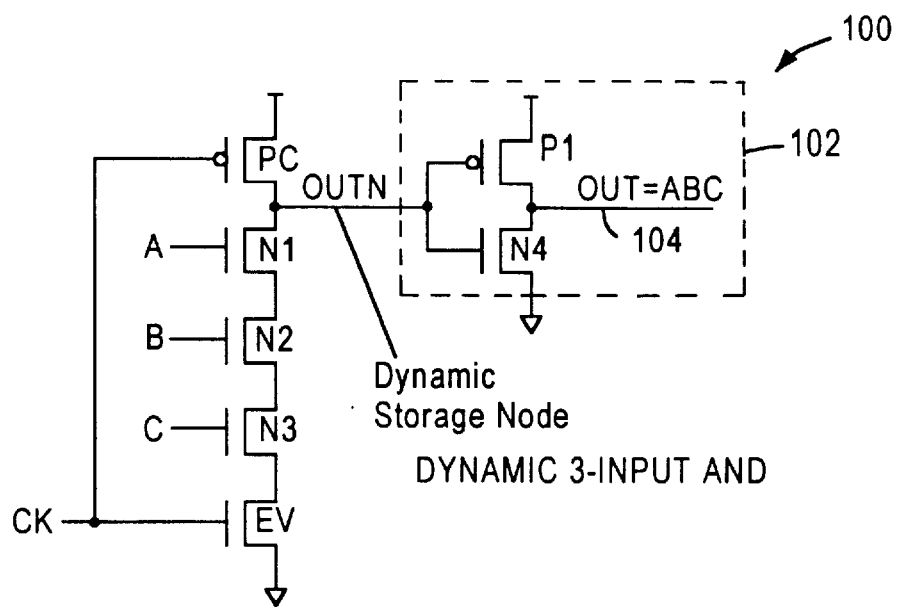
FIG. 1 is a schematic diagram of an exemplary conventional dynamic logic gate.
Figure 2:
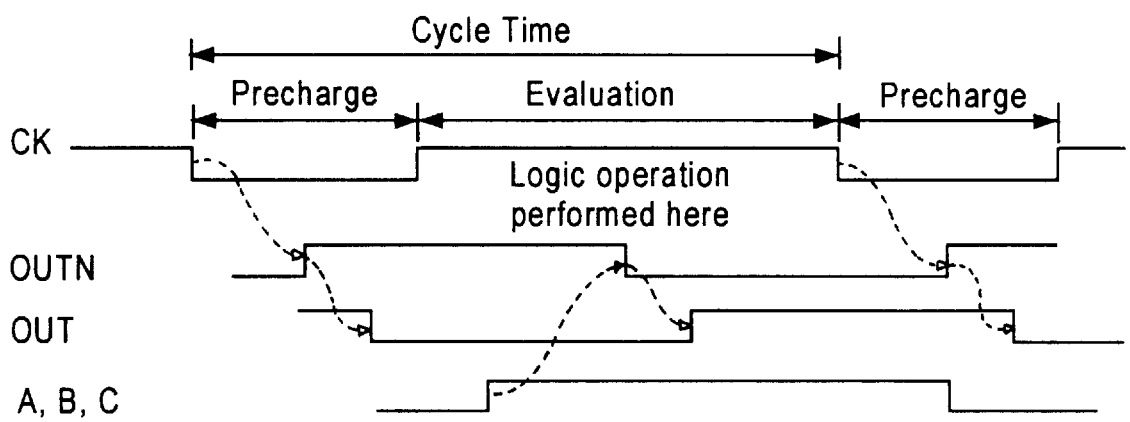
FIG. 2 is a timing diagram illustrative of the operation of a conventional dynamic logic gate.
Figure 3:
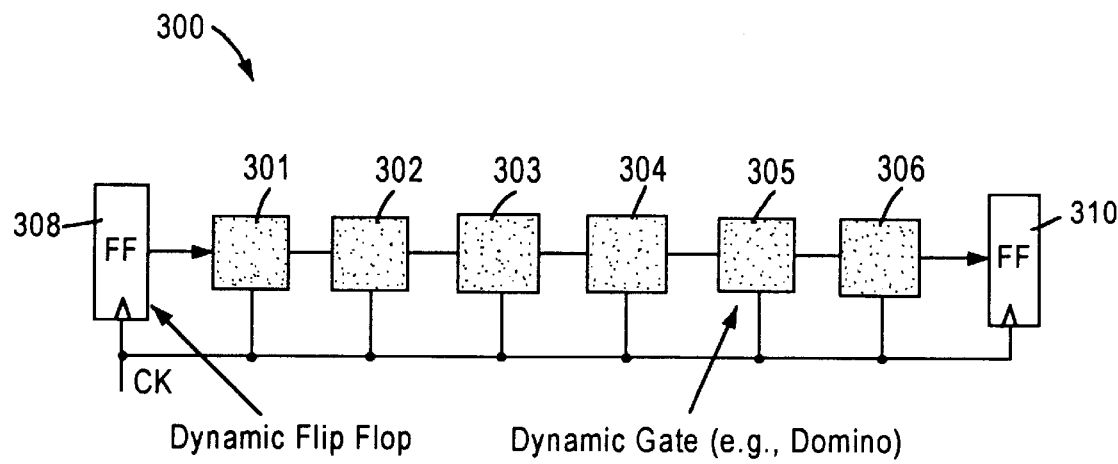
FIG. 3 is a block diagram of a conventional dynamic logic subcircuit for use in a single-phase clocking scheme.
Figure 4:
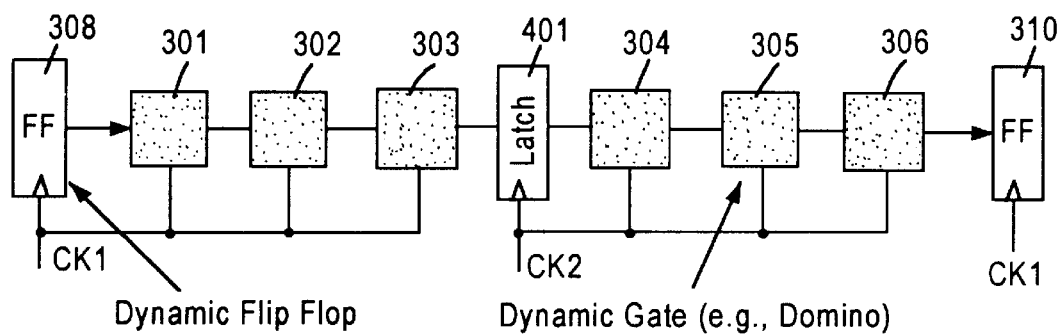
FIG. 4 is a block diagram of a conventional dynamic logic subcircuit for use in a non-overlapping two-phase clocking scheme.
Figure 5:
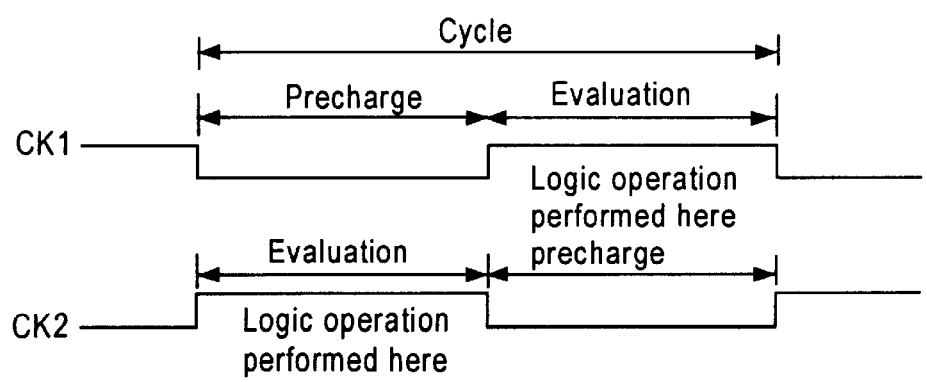
FIG. 5 is a timing diagram illustrating a conventional non-overlapping two-phase clocking scheme.

In a next step 905, based on the arrival times of each critical signal, the delays between adjacent clock phases are predetermined so that the clock phases are non-blocking. More specifically, the delays between adjacent clock delays are adjusted so that each clock phase received by a particular dynamic logic gate arrives before this logic gate's critical signal(s). The term "non-blocking" is described further below in conjunction with FIGS. 10 and 11. Because the clock phases are overlapping and non-blocking, each dynamic logic gate can immediately operate on the critical input signal(s) upon receipt of the critical signal without having to wait for the clock phase received by this particular dynamic logic gate to enter the evaluation phase. Thus, the critical signals can propagate through the subcircuit 700 without the additional time penalties associated with the insertion of latches described above in conjunction with FIGS. 4 and 5, thereby further increasing the speed of the subcircuit 700.

Figure 10:
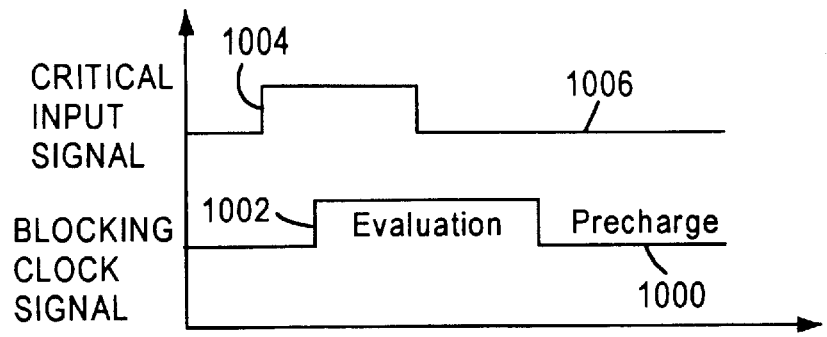
FIG. 10 is a timing diagram illustrating a blocking clock signal.
Figure 11:
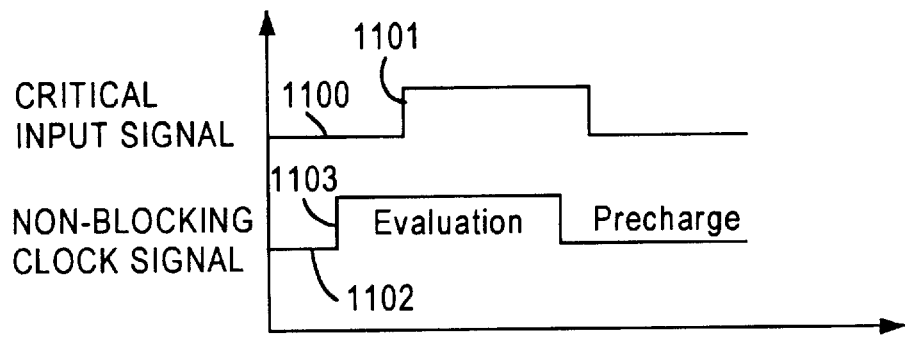
FIG. 11 is a timing diagram illustrating a non-blocking clock signal.

The term "non-blocking" is used herein to denote that the clock phase received by a particular dynamic logic gate enters the evaluation phase before that dynamic logic gate receives its latest arriving or critical input signal. FIG. 10 illustrates a "blocking" clock signal 1000. The leading edge 1002 of the blocking clock signal 1000 arrives at the dynamic logic gate (not shown) after the leading edge 1004 of the latest arriving input signal 1006. Conversely, FIG. 11 is a timing diagram illustrating a non-blocking clock signal. The input signal 1100 is the critical signal received by the dynamic logic (not shown). The leading edge 1101 of the critical input signal 1100 occurs after the leading edge 1103 (also a rising edge in this example) of the clock signal 1102 received by the dynamic logic gate.

It will be understood by those skilled in the art of dynamic logic that in FIG. 11, the non-blocking time of the dynamic logic gate is zero (the term "non-blocking time" is used herein to refer to the time the evaluation phase must precede the arrival of the input signal to prevent blocking). If the non-blocking time is non-zero, then the leading edge of the clock signal must arrive a certain minimum time before the arrival of the input signal.

Referring back to FIG. 9, in a next step 907, the minimum duration of the evaluation overlaps are determined, based on the timing characteristics of the dynamic logic gates. For example, the evaluation overlap must be long enough so that any output signal generated by a dynamic logic gate clocked during a clock phase $CK_i$ has a pulse width at least as long as the minimum pulse width required by the dynamic logic gate clocked by the clock phase $CK_{i+1}$. The order of the steps 905 and 907 can be reversed.

Thus, the minimum evaluation overlap time must determined in addition to the phase delay between adjacent clock phases. In some cases, a set of delays that are non-blocking while meeting the evaluation overlap requirements of the dynamic logic gates may not exist for the given implementation.

In an alternative embodiment, to standardize the clock generator and ease the design process, the clock phases may be designed with a predetermined duty cycle and time lag so as result in an evaluation overlap with sufficient margin to "beat" the arrival of all of the critical signals in the subcircuit while ensuring a safe transition of signals across adjacent clock phases. This standardized scheme is advantageously used for predominantly "regular" (as opposed to random) logic circuits in which the arrival times of the critical input signals tend to be similar for all of the dynamic logic gates in the subcircuit. Further, to maximize the speed of the entire circuit, the delay between clock phases should be determined so that the clock phases are non-blocking for all of the critical signals. This analysis tends to be more practical for regular circuits than for random combinational circuits, which typically have a very large number of critical paths that must be analyzed and adjusted for.

Figure 12:
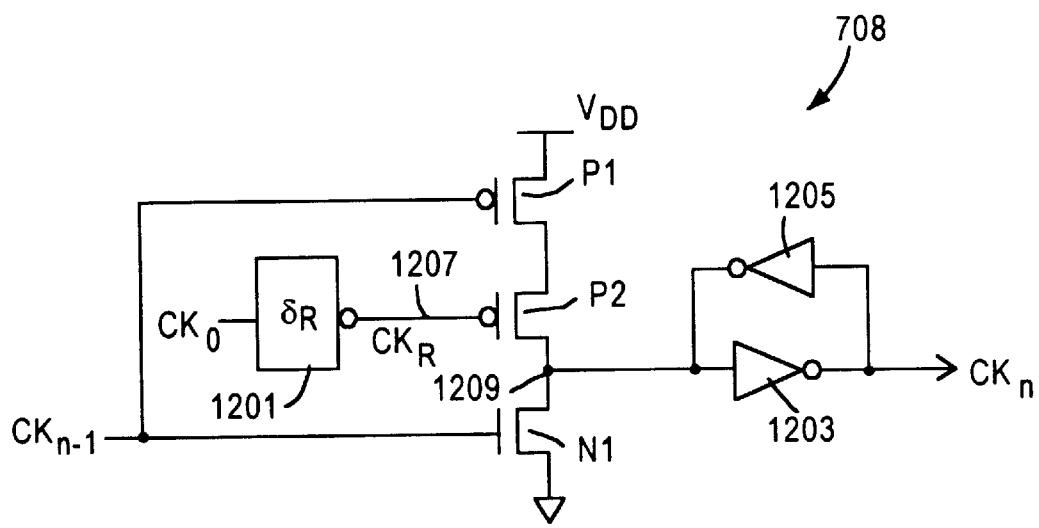
FIG. 12 is a circuit diagram of a clock stretcher according to one embodiment of the present invention.

FIG. 12 is circuit diagram of the clock stretcher 708 (FIG. 7). The clock stretcher operates to ensure that the evaluation phase of the last clock phase extends past the primary clock cycle boundary (i.e., extends beyond the leading edge of the next cycle of the primary clock). This feature becomes important when clocking at low frequencies (e.g., during testing of commercial integrated circuits using this clocking system). The evaluation phase of the last clock phase must be so extended because at low frequencies, the last clock phase may enter the next precharge phase well before the start of the next primary clock cycle, thereby losing the evaluated output signal of the last dynamic logic gate before being sampled by the flip-flop 705. That is, because the flip-flop 705 samples the output signal from the last dynamic logic gate $703_n$ at the leading edge of the next primary clock cycle, the evaluation phase of the last phase must be extended into the next primary clock cycle to ensure that the evaluated output signal of the dynamic logic gate $703_n$ is sampled.

This embodiment of the clock stretcher 708 includes two p-channel transistors P1 and P2, an n-channel transistor N1, an inverting delay buffer 1201 and two inverters 1203 and 1205. The inverting delay buffer 1201 has an input lead connected to receive the primary clock signal $CK_0$. The inverting delay buffer 1201 can be implemented with a single inverter or, alternatively, three series connected inverters, so as to provide a delayed and inverted version (i.e., clock signal $CK_R$) of the primary clock signal CK0 on an output lead 1207. In this example, the delay provided by the inverting delay buffer 1201 is denoted $\delta_R$.

The transistor P1 has its source connected to a VDD voltage source, its gate connected to receive the penultimate clock phase $CK_{n-1}$, from the clock generator 707 (FIG. 7) and its drain connected to the source of the transistor P2. The transistor P2 has its gate connected to receive the clock signal $CK_R$ from the inverting delay buffer 1201, and its drain connected to the drain of the transistor N1 (through an internal node 1209. The transistor N1 has its gate connected to receive the clock phase $CK_{n-1}$, and its source connected to a ground source (i.e., GROUND). The inverters 1203 and 1205 form a latch circuit connected to invert and latch the voltage present at the internal node 1203. More specifically, the input lead of the inverter 1203 is connected to the internal node 1209 and to the output lead of the inverter 1205. The output lead of the inverter 1203 is connected to the input lead of the inverter 1205. The latch formed by the inverters 1203 and 1205 provides the last clock phase $CK_n$ at the output lead of the inverter 1203.

The clock stretcher 708 operates as follows. At the start of the evaluation phase (i.e., the rising edge) of the previous adjacent clock phase $CK_{n-1}$, the voltage at the internal node 1209 is discharged to a logic low level regardless of the logic level of the clock signal $CK_R$. As a result of this logic low level, the latch formed by the inverters 1203 and 1205 causes the clock phase $CK_n$ to be at a logic high level. However, when the clock phase $CK_{n-1}$ transitions to a logic low level when its evaluation phase ends, the voltage at the internal node 1209 is not pulled up unless the clock signal $CK_R$ transitions to a logic high level. Because the clock signal $CK_R$ is a delayed (i.e., by duration $\delta_R$) and inverted version of the primary clock signal $CK_0$, the clock signal $CK_R$ does not transition to a logic high level until after the primary clock signal $CK_0$ enters the next evaluation phase. More specifically, the falling edge of the clock signal $CK_R$ (which occurs $\delta_R$ after the rising edge of the primary clock signal $CK_0$) the voltage at the internal node 1209 is pulled up to a logic high level, thereby causing the clock phase $CK_n$ to transition to a logic low level. Accordingly, even at low frequencies, the clock phase $CK_n$ is "stretched" so that the evaluation phase of the clock phase $CK_n$ extends beyond the boundary of the next cycle of the primary clock signal $CK_0$. This stretching of the clock phase $CK_n$ helps to ensure that the flip-flop 705 (FIG. 7) can sample the output signal(s) of the dynamic logic gate $703_n$ (FIG. 7).

Figure 13:
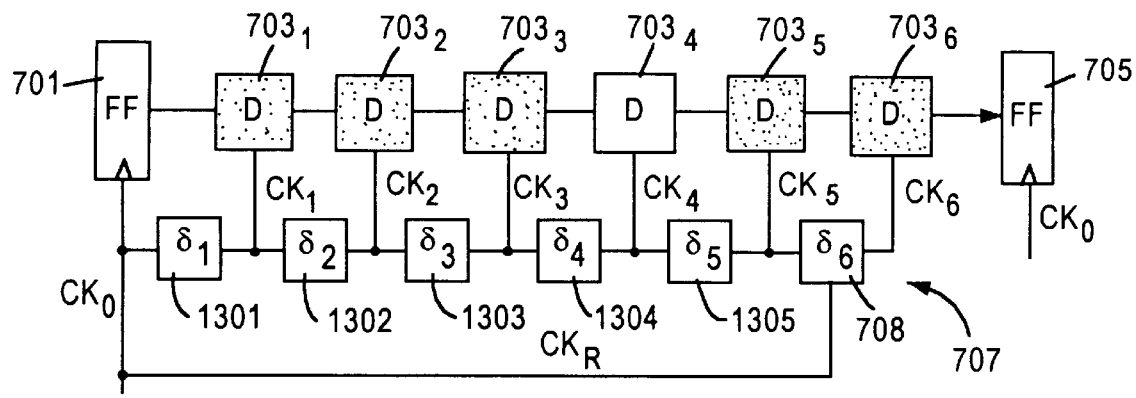
FIG. 13 is a circuit diagram of a clock generator according to one embodiment of the present invention.

FIG. 13 is a circuit diagram of one embodiment of the clock generator 707 (FIG. 7) having six domino-type dynamic logic gates, according to the present invention. The clock generator 707 includes non-inverting delay circuits 1301–1305 in addition to the clock stretcher 708 (FIG. 7) and the inverting delay buffer 1201 (FIG. 12). In particular, the first non-inverting delay circuit 1301 is connected to receive the primary clock signal $CK_0$ provides a clock phase $CK_1$ to the first dynamic logic gate $703_1$ and the second non-inverting delay circuit 1302. The clock phase $CK_1$ is equivalent to the primary clock signal $CK_0$ delayed by duration $\delta_1$. Similarly, the second non-inverting delay circuit 1302 provides a clock phase $CK_2$ to the second dynamic logic gate $703_2$ and the second non-inverting delay circuit 1303. The clock phase $CK_2$ is equivalent to the clock phase $CK_1$ delayed by duration $\delta_2$. Likewise, the third non-inverting delay circuit 1303 provides a clock phase $CK_3$ to the third dynamic logic gate $703_3$ and the fourth non-inverting delay circuit 1304 and so on, until the fifth non-inverting delay circuit 1305. Instead, the fifth non-inverting delay circuit 1305 provides the clock phase $CK_5$ to the fifth dynamic logic gate $703_5$ and the clock stretcher 708. In this embodiment, the clock stretcher 708 (described above in conjunction with FIG. 12) provides the clock phase $CK_6$ that is "stretched" to ensure that the clock phase $CK_6$ only enters the evaluation phase after the next cycle of the primary clock signal $CK_0$ begins. In this embodiment, the non-inverting delay circuits 1301–1305 are implemented using two inverters that are connected series. The durations $\delta_1$–$\delta_6$ of the delays provided by the non-inverting delay circuits 1301–1305 and the inverting delay circuit 708 can be adjusted by adjusting the size of the inverters implementing these delay circuits, or by "skewing" these inverters, or even by inserting an even number of series-connected inverters.

Figure 14:
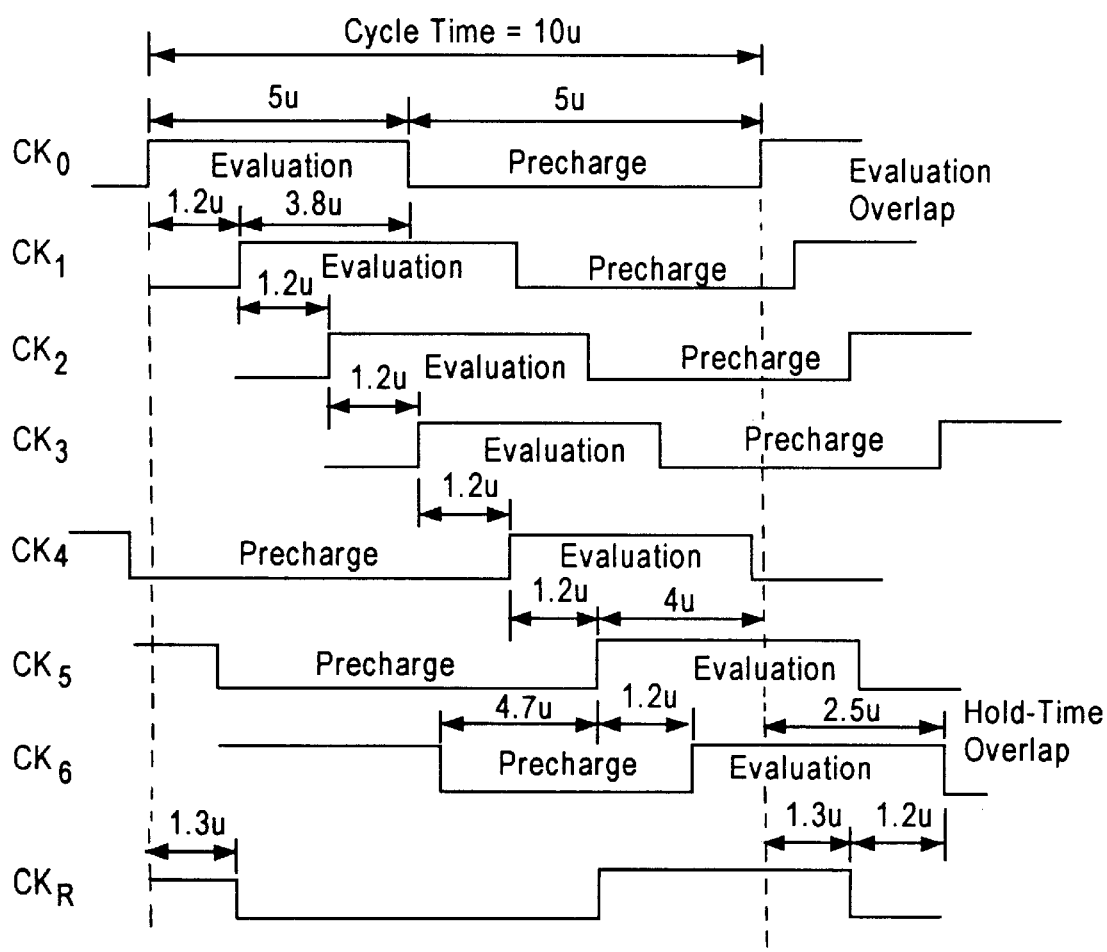
FIG. 14 is a timing diagram illustrative of the signal flow in the circuit of FIG. 13, according to one embodiment of the present invention.

FIG. 14 is a timing diagram illustrating the operation of the clock generator 707 (FIG. 13), according to one embodiment of the present invention. Referring to FIGS. 13 and 14, the clock generator 707 operates as follows. In this example, the cycle time of the primary clock signal $CK_0$ (and the clock phases $CK_1$–$CK_6$) is equivalent to ten unit gate delays (i.e., 10 u, where 1 u=one unit gate delay). The six clock phases were predetermined to have a duty cycle in which the precharge phase is about 50% of the cycle time or 5 u. Thus, the evaluation phase is also about 50% of the cycle time or 5 u. The clock stretcher 708 introduces a delay of about 1.2 u relative to the clock phase $CK_5$. Similarly, each non-inverting delay circuit 1301–1305 also introduces a delay of about 1.2 u, resulting in an evaluation overlap of about 38% between adjacent clock phases.

The clock stretcher 708 provides the clock phase $CK_6$ so that the clock phase $CK_6$ overlaps the evaluation phase of the next cycle time of the primary clock signal $CK_0$ of 25% of the cycle time or 2.5 u. This overlap is referred to herein as the "hold time overlap". The hold time overlap must be large enough to ensure that any output signal generated by the dynamic logic gate $703_6$ during the evaluation phase of the clock phase $CK_6$ can be correctly received by the flip-flop 705. Because the flip-flop 705 is typically edge-triggered, the hold time overlap can be significantly shorter than the evaluation overlap required by the dynamic logic gates. FIG. 14 also shows the delayed and inverted clock signal $CK_R$, which is used by the clock stretcher 708 in generating the clock phase $CK_6$. In this example, the clock signal $CK_R$ is delayed relative to the primary clock signal $CK_0$ by about 1.3 u. Thus, when added to a delay of about 1.2 u provided by the clock stretcher 708, the hold time overlap is about 2.5 u.

For many applications, the 1.2 u delay between adjacent clock phases is short enough to make the clock phases non-blocking while providing enough overlap to guarantee a safe transition of signals across adjacent clock phase boundaries. The precharge time of 5 u is typically more than large enough to precharge the dynamic logic gates. The 5 u evaluation overlap provides a relatively large margin for valid transition of output signals across adjacent clock signals and accounting for clock signal skew and jitter. The hold time overlap of 2.5 u is large enough to satisfy the hold time requirements of typical edge-triggered flip-flops in the presence of clock skew and jitter.

Figure 15:
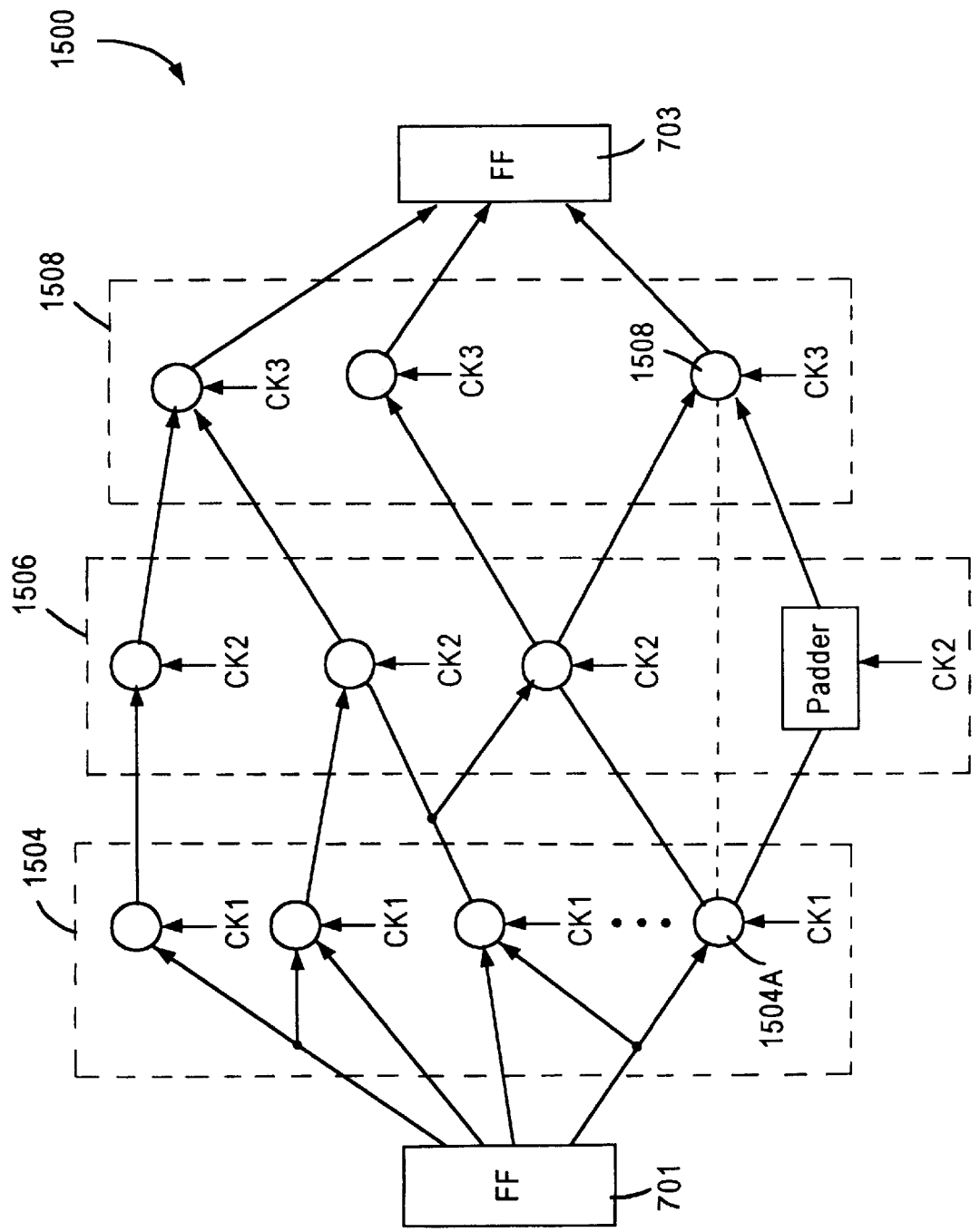
FIG. 15 is a block diagram of an exemplary dynamic logic subcircuit illustrating a skipped clock phase.

FIG. 15 is a block diagram of a dynamic logic gate subcircuit 1500 with a padder gate 1502 to avoid skipping a clock phase. The padder gate 1502 is a dynamic non-inverting delay gate that merely passes the received input signal to its output lead. In this example, the subcircuit 1500 includes dynamic logic gates 1504 connected to receive the clock phase $CK_1$ and input signals from the flip-flop 701. In this example, additional dynamic logic gates 1506, as well as the padder gate 1502, are coupled to receive the output signals from the dynamic logic gates 1504 and the clock signal $CK_2$. The padder gate 1502 and the dynamic logic gates 1506 are coupled to provide output signals to dynamic logic gates 1508, which are clocked by the clock signal $CK_3$.

However, as indicated by the dashed line 1510, the output lead of the dynamic logic gate 1504A was originally connected to the input lead of the dynamic logic gate 1508A. Thus, in the logic path leading from the dynamic logic gate 1504A to the dynamic logic gate 1508A, the clock phase $CK_2$ was skipped. Because a clock phase was skipped, the output signal provided by the dynamic logic gate 1504A might not meet the minimum input signal pulse width required by the dynamic logic gate 1508A. Thus, the padder gate 1502 is inserted to receive the output signal from the dynamic logic gate 1504A and propagate this output signal unchanged to the dynamic logic gate 1508A, after a delay. Because the padder gate 1502 is clocked by the clock phase $CK_2$, the output signal generated by the padder gate 1502 is ensured to meet the minimum pulse width requirement of the dynamic logic gate 1508A. In accordance with the present invention, whenever a skipped clock phase occurs in a logic path, a padder gate is inserted and coupled to receive the skipped clock phase.

The embodiments of the non-blocking multiple-phase clocking system described above are illustrative of the principles of this invention and are not intended to limit the invention to the particular embodiments described. For example, different implementations of the clock generator can be used, along with different duty cycles and delay times, to optimize the performance of the dynamic logic subcircuit. Accordingly, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for providing clock phases to a plurality of n dynamic logic gates, the plurality of dynamic logic gates being connected in series with a first dynamic logic gate connected to a second dynamic logic, the second dynamic logic gate being connected to a third dynamic logic gate and so on until the nth dynamic logic gate, n being an integer greater than one, the method comprising:
   receiving a clock signal $CK_0$;
   generating n clock phases $CK_1$–$CK_n$, the clock phase $CK_1$ being delayed relative to the clock signal $CK_0$, the clock phase $CK_2$ being delayed relative to the clock phase $CK_1$ and so on to the clock phase $CK_n$; and
   providing the clock phase $CK_1$ to the first dynamic logic gate, the clock phase $CK_2$ to the second dynamic logic gate, . . . , and the clock phase $CK_n$ to the nth dynamic logic gate.

2. The method of claim 1 wherein the delays between the clock phases $CK_1$–$CK_n$ are predetermined so that each clock phase is non-blocking.

3. The method of claim 1 wherein the delay between a pair of adjacent clock phases $CK_i$ and $CK_{i+1}$ is provided using a set of series-connected inverters coupled to receive the clock phase $CK_i$, the set of inverters outputting the clock phase $CK_{i+1}$, where i is an integer between one and (n−1).

4. The method of claim 1 wherein the clock phases $CK_1$–$CK_n$ have substantially equal duty cycles.

5. The method of claim I wherein each pair of adjacent clock phases $CK_i$ and $CK_{i+1}$ has an evaluation overlap with a duration at least as great as a minimum pulse width of the dynamic logic gate coupled to receive the clock phase $CK_{i+1}$, summed with a propagation delay of the dynamic logic gate coupled to receive the clock phase $CK_i$ and minus a reset time of the dynamic logic gate coupled to receive the clock phase $CK_{i+1}$, where i is an integer between one and (n−1).

6. The method of claim 5 wherein each pair of adjacent clock phases of the clock phases $CK_1$–$CK_n$ have evaluation overlaps that are substantially equal.

7. The method of claim 1 wherein the plurality of delay circuits provide delays that are substantially equal.

8. The method of claim 1 further comprising extending an evaluation phase of the clock phase $CK_n$ beyond a leading edge of a next clock cycle of the clock signal $CK_0$ by a duration at least equal to a hold time of a flip-flop coupled to receive an output signal of the nth dynamic logic gate.

9. The method of claim 1 further comprising coupling a padder in series between a kth dynamic logic gate and a (k+1)th dynamic logic gate, the kth dynamic logic gate being coupled to receive a kth clock phase, the padder being coupled to receive a (k+1)th clock phase and the (k+1)th dynamic logic gate being coupled to receive a (k+2)th clock phase, k being an integer between two and (n−2), wherein the kth clock phase, (k+1)th clock phase and the (k+2)th clock phase are three adjacent clock phases of the clock phases $CK_1$–$CK_n$.

10. A method for providing clock phases to a plurality of n dynamic logic gates, the plurality of dynamic logic gates being connected in series with a first dynamic logic gate connected to a second dynamic logic, the second dynamic logic gate being connected to a third dynamic logic gate and so on until the nth dynamic logic gate, n being an integer greater than one, the method comprising:

determining an arrival time of one or more critical signals received by each dynamic logic gate of the plurality of dynamic logic gates; and determining a delay between adjacent clock phases of n clock phases $CK_1$–$CK_n$ to be provided to the plurality of dynamic logic gates, the clock phase $CK_1$ to be received by the first dynamic logic gate, the clock phase $CK_2$ to be received by the second dynamic logic gate, . . . , and the clock phase $CK_n$ to be received by the nth dynamic logic gate, wherein the delay causes each dynamic logic gate of the plurality of dynamic logic gates to receive a clock phase before receiving a critical signal.

11. The method of claim 10 further comprising:

determining a minimum overlap period for each pair of adjacent clock phases of the clock phases $CK_1$–$CK_n$ so that each dynamic logic gate receives a critical signal provided by a preceding dynamic logic gate with sufficient time to evaluate the critical signal; and determining a duty cycle of each clock phase of the clock phases $CK_1$–$CK_0$ so that each pair of adjacent clock phases has an overlap period greater than or equal to its minimum overlap period.

12. The method of claim 10 wherein the plurality of dynamic logic gates comprises domino logic gates.

13. The method of claim 10 wherein each pair of adjacent clock phases $CK_i$ and $CK_{i+1}$ has an evaluation overlap with a duration at least as great as a minimum pulse width of the dynamic logic gate coupled to receive the clock phase $CK_{i+1}$, summed with a propagation delay of the dynamic logic gate coupled to receive the clock phase $CK_i$ and minus a reset time of the dynamic logic gate coupled to receive the clock phase $CK_{i+1}$, where i is an integer between one and (n−1).

14. The method of claim 10 further comprising coupling a padder in series between a kth dynamic logic gate and a (k+1)th dynamic logic gate, the kth dynamic logic gate being coupled to receive a kth clock phase, the padder being coupled to receive a (k+1)th clock phase and the (k+1)th dynamic logic gate being coupled to receive a (k+2)th clock phase, k being an integer between two and (n−2), wherein the kth clock phase, (k+1)th clock phase and the (k+2)th clock phase are three adjacent clock phases of the clock phases $CK_1$–$CK_n$.

15. The method of claim 10 wherein an evaluation phase of the clock phase $CK_n$ extends beyond a leading edge of the next clock cycle of a primary clock signal by a duration at least equal to a hold time of a flip-flop coupled to receive an output signal of the nth dynamic logic gate.

16. The method of claim 15 further comprising generating the clock phase $CK_1$ by delaying the primary clock signal, the primary clock signal being provided to a first flip-flop and a second flip-flop, the first and second flip-flops being respectively coupled to the first and nth dynamic logic gates.

17. A computer system comprising:

a memory;

an interface;

a peripheral coupled to said interface; and a processor coupled to said memory and said interface, said processor including a circuit for providing clock phases to a plurality of n dynamic logic gates, the plurality of dynamic logic gates being connected in series with a first dynamic logic gate connected to a second dynamic logic, the second dynamic logic gate being connected to a third dynamic logic gate and so on until the nth dynamic logic gate, n being an integer greater than one, the circuit comprising:

a plurality of n delay circuits connected in series, a first delay circuit of said plurality being coupled to receive a primary clock signal $CK_0$ and configured to provide a first clock phase $CK_1$ delayed relative to the primary clock signal $CK_0$, a second delay circuit coupled to receive the first clock phase $CK_1$ and configured to provide a second clock phase $CK_2$ delayed relative to the first clock phase $CK_1$ and so on, with said nth delay circuit being coupled to receive an (n−1)th clock phase $CK_{n-1}$ and configured to provide an nth clock phase $CK_n$ delayed relative to the (n−1)th clock phase $CK_{n-1}$, wherein the first dynamic logic gate is coupled to receive the first clock phase $CK_1$, the second dynamic logic gate is coupled to receive the second clock phase $CK_2$ and so on with the nth dynamic logic gate being coupled to receive the nth clock phase $CK_n$.

18. The system of claim 17 wherein the delays between the n clock phases $CK_1$–$CK_n$ are predetermined so that each clock phase $CK_1$–$CK_n$ is non-blocking.

19. The system of claim 17 wherein each pair of adjacent clock phases $CK_i$ and $CK_{i+1}$ has an evaluation overlap with a duration at least as great as a minimum pulse width of the dynamic logic gate coupled to receive the clock phase $CK_{i+1}$, summed with a propagation delay of the dynamic logic gate coupled to receive the clock phase $CK_i$ and minus a reset time of the dynamic logic gate coupled to receive the clock phase $CK_{i+1}$, where i is an integer between one and (n−1).

20. The system of claim 17 wherein an evaluation phase of the nth clock phase $CK_n$ extends beyond a leading edge of the next clock cycle of the primary clock signal $CK_0$ by a duration at least equal to a hold time of a flip-flop coupled to receive an output signal of the nth dynamic logic gate.

* * * * *